United States Patent
Gilliland et al.

(10) Patent No.: US 6,556,608 B1
(45) Date of Patent: *Apr. 29, 2003

(54) SMALL FORMAT OPTICAL SUBASSEMBLY

(75) Inventors: Patrick B. Gilliland, Chicago, IL (US); Carlos Jines, Forest Park, IL (US); Robert M. Dwarkin, Chicago, IL (US)

(73) Assignee: Stratos Lightwave, Inc., Chicago, IL (US)

( * ) Notice: Subject to any disclaimer, the term of this patent is extended or adjusted under 35 U.S.C. 154(b) by 133 days.

This patent is subject to a terminal disclaimer.

(21) Appl. No.: 09/826,480

(22) Filed: Apr. 5, 2001

Related U.S. Application Data

(63) Continuation-in-part of application No. 09/545,087, filed on Apr. 7, 2000, now Pat. No. 6,331,992.

(51) Int. Cl.$^7$ ................................................. H01S 3/19
(52) U.S. Cl. ............................. 372/50; 372/43; 372/99
(58) Field of Search ............................. 372/50, 48, 43, 372/36, 92, 99; 385/93, 92, 88, 14

(56) References Cited

U.S. PATENT DOCUMENTS

| | | | | |
|---|---|---|---|---|
| 5,812,582 A | * | 9/1998 | Gilliland et al. | 372/50 |
| 5,815,623 A | | 9/1998 | Gilliland et al. | 385/93 |
| 5,938,952 A | | 8/1999 | Lin et al. | 219/121 |
| 6,004,046 A | | 12/1999 | Sawada | 385/92 |
| 6,005,276 A | | 12/1999 | Forrest et al. | 257/432 |
| 6,014,476 A | * | 1/2000 | Meyer-Gueldner et al. | 385/14 |
| 6,071,017 A | * | 6/2000 | Gilliland et al. | 385/93 |
| 6,283,644 B1 | * | 9/2001 | Gilliland et al. | 372/93 |
| 6,349,105 B1 | * | 2/2002 | Gilliland et al. | 372/50 |
| 6,416,238 B1 | * | 7/2002 | Gilliland et al. | 385/88 |
| 6,331,992 B1 | * | 12/2002 | Gilliland et al. | 372/50 |

OTHER PUBLICATIONS

Data Sheet—MLC–25–4–X–TL Optical Gigabit Ethernet–+ 3.3V (10 pages), Methode Electronics, Inc., Optoelectronic Products.

Data Sheet—Preliminary Technical Specification of 1.3um MQW–FP Laser Diode Module: (Transmitter Optical Sub-–assembly) SLT2160–LN Series, Sumitomo Electric Industries, Ltd., (6 pages)—Oct. 5, 1999.

Drawing No. 230–019, "1300 nm Laser Diode MTS," Methode Electronics, Inc., Jan. 25, 1999.

Photocopy of photograph of Methode Electronics, Inc.'s 1300 nm Laser Diode MTS.

\* cited by examiner

*Primary Examiner*—Leon Scott, Jr.
(74) *Attorney, Agent, or Firm*—Karl D. Kovach

(57) ABSTRACT

A small format optoelectronic package or device includes a non-electrically conductive substrate partially covered by an electrically conductive can. The electrically conductive can has a transparent element affixed to an aperture of the electrically conductive can. The electrically conductive can encloses and hermetically seals an edge emitting optical diode, a reflecting mirror, a monitor diode, and conductors between the electrically conductive can and the non-electrically conductive substrate. The non-electrically conductive substrate has three through-holes formed through a thickness of the non-electrically conductive substrate. The three through-holes are filled with an electrically conductive material so as to form three electrically conductive vias. Additionally, a surface of the non-electrically conductive substrate is organized into three regions. The first and third regions have the electrically conductive plating material applied thereto.

4 Claims, 15 Drawing Sheets

US 6,556,608 B1

SMALL FORMAT OPTICAL SUBASSEMBLY

RELATED U.S. APPLICATION DATA

This application is a continuation-in-part of U.S. patent application Ser. No. 09/545,087, filed Apr. 7, 2000 now U.S. Pat. No. 6,331,992 which is hereby incorporated herein by reference.

BACKGROUND OF THE INVENTION

1. Field of the Invention

The present invention pertains to optoelectronic devices or optical subassemblies. The invention more particularly concerns a small format optoelectronic package.

2. Discussion of the Background

Optoelectronic devices such as optical transceivers are known in the art and include active optical devices or diode packages. Common diode packages include LED packages such as a TO-46 package or a 5.6 mm TO style laser diode package such as an RLD-85PC diode package by Rohm, Incorporated. These diode packages or TO cans typically include a metallic housing having a laser diode or LED for transmitting data and a photo diode for performing power-monitoring, metal contact leads exiting from the diodes for connection to a power source and a cover glass opposed to the diode, through which the energy is transmitted. Discussion of the power-monitoring and feedback control of the laser diode by the photo diode is presented in U.S. Pat. Nos. 5,812,582 and 5,815,623. U.S. Pat. Nos. 5,812,582 and 5,815,623 are hereby incorporated herein by reference. The TO can is hermetically sealed. Often, optics housings are metallic so as to provide ruggedness, ease of machining complicated shapes, and to enhance shielding of electromagnetic fields.

Smaller optoelectronic packages allow the devices into which the optoelectronic packages are placed to become smaller. Smaller optoelectronic packages allow for a higher density of data transmission in a given space. Currently, there is a great demand for smaller optoelectronic packages.

FIG. 8 is a partial cross-sectional pictorial view of an optoelectronic package 200. The optoelectronic package 200 includes a base element 212, posts 206, 208, 210, extending through the base element 212 and secured thereto with solidified molten glass 214, a monitor diode 204 mounted on the base element 212, an optical emitting element 202 mounted on the monitor diode 204, a can 218 and lens 216 enclosing the monitor diode 204 and the optical emitting element 202. In an effort to reduce space, the optical emitting element 202 is mounted on top of the monitor diode 204. Electrically conductive posts 206, 208, 210 extend through through-holes in the electrically conductive base element 212. The posts 206, 208, 210 are electrically insulated from the base element 212 by solidified molten glass 214 which also attaches the posts 206, 208, 210 to the base element 212. The posts 206, 208, 210 are large as compared to the other components and require a large area for their mounting and placement.

At minimum, the diameter across the base element 212 is approximately 3.8 millimeters, as incorporated on the SLT2160-LN series of transmitter optical sub-assemblies manufactured by Sumitomo Electric Industries, Ltd. Thus, if two of these devices are placed side-by-side, on the same plane, the distance between the optical axes is, hypothetically, at best, 3.8 millimeters. However, typically, the optical axes are separated by 6.25 millimeters, due to packaging constraints as in typical LC duplex transceivers such as Methode Electronics, Inc.'s, part number MLC-25-4-X-TL which is described in the data sheet entitled, "MLC-25-4-X-TL Optical Gigabit Ethernet—+3.3V Small Form Factor (SFF) Transceiver—1.25 GBaud."

Therefore, there is a need in the industry for a small format optoelectronic package that has a small diameter and is easy to manufacture. Furthermore, there is a need for an optoelectronic package that can be placed adjacent to another optoelectronic package.

SUMMARY OF THE INVENTION

Therefore, it is an object of the present invention to provide a small format optoelectronic device.

It is still another object of the invention to provide a small format optoelectronic device which is hermetically sealed and economical to manufacture.

Yet another object of the invention is to provide a small format optoelectronic device which is able to be placed adjacent to another small format optoelectronic device.

It is a further object of the invention to provide a small format optoelectronic device which is easy to install, and provides for more efficient utilization of the limited surface area by incorporating rectangular geometry.

In one form of the invention, the small format optoelectronic package or device includes a non-electrically conductive substrate partially covered by an electrically conductive can. The electrically conductive can has a transparent element affixed to an aperture of the electrically conductive can. The electrically conductive can encloses and hermetically seals an edge emitting optical diode, a reflecting mirror, a monitor diode, and conductors between the electrically conductive can and the non-electrically conductive substrate. The non-electrically conductive substrate has three through-holes formed through a thickness of the non-electrically conductive substrate. The three through-holes are filled with an electrically conductive material so as to form three electrically conductive vias. When co-fired with the substrate, the electrically conductive vias form a hermetic seal. Additionally, a surface of the non-electrically conductive substrate is organized into three regions. The first and third regions have the electrically conductive plating material applied thereto. The first through-hole protrudes through the first region. The second and third through-holes protrude through the second region. The first via is electrically connected to the electrically conductive plating material adhered to the first region. The edge emitting optical diode and the monitor diode both have leads which are mounted on the electrically conductive plating of the first region. A first conductor electrically connects another lead of the edge emitting optical diode to the second via, and a second conductor electrically connects another lead of the monitor diode to the third via. The edge emitting optical diode emits an optical signal along a first optical axis. The reflecting mirror intersects the first optical axis and reflects the optical signal from the first optical axis to a second optical axis.

In another form of the invention, two of the small format optoelectronic packages discussed above are placed on the same plane. The optical axis of one package is parallel to the optical axis of the other package. Also, the optical axis of one package is separated from the optical axis of the other package by less than 3.25 millimeters.

Thus, the device of the invention is superior to existing optoelectronic devices. The small format optoelectronic package of the invention eliminates the use of large and bulky components, and replaces them with smaller components through use of a unique combination of materials and arrangement of the materials. Thus, the device of the invention is smaller than the prior art device.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE PRESENTLY PREFERRED EMBODIMENTS

Figure 1:
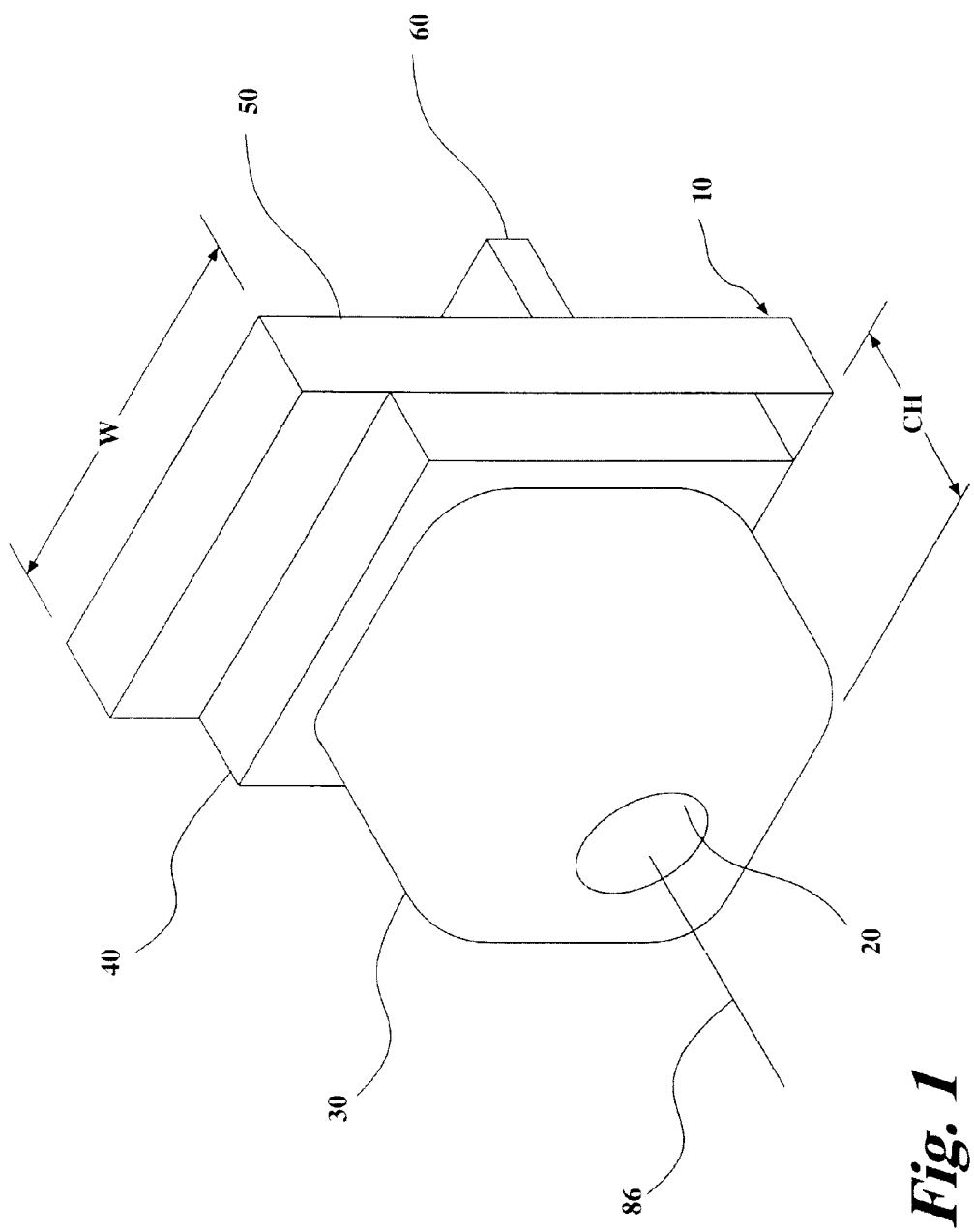
FIG. 1 is a perspective view of an optoelectronic package.

Referring now to the drawings, wherein like reference numerals designate identical or corresponding parts throughout the several views, and more particularly to FIGS. 9–20 thereof, is a small format optoelectronic package or device having an edge emitting optical diode 300 and a reflecting mirror 360, 410 taking the place of the optical diode 80 displayed in FIGS. 1–7. However, a small format optoelectronic package or device 10, 110 as shown in FIGS. 1–7 is discussed first since the embodiments disclosed in FIGS. 9–20 depend on the disclosure of the devices 10, 110.

FIG. 1 is a perspective view of the optoelectronic package 10 which shows a transparent element 20 mounted in an electrically conductive can 30, where the electrically conductive can 30 is mounted on and sealed to an electrically conductive plating adhered to a non-electrically conductive substrate. The device 10 can be attached to a housing of another structure by way of the holder 50.

The holder 50 is mounted to the non-electrically conductive substrate 40. The holder 50 has a width dimension W. A flex connector 60 is attached to a second side of the non-electrically conductive substrate 40.

Figure 2:
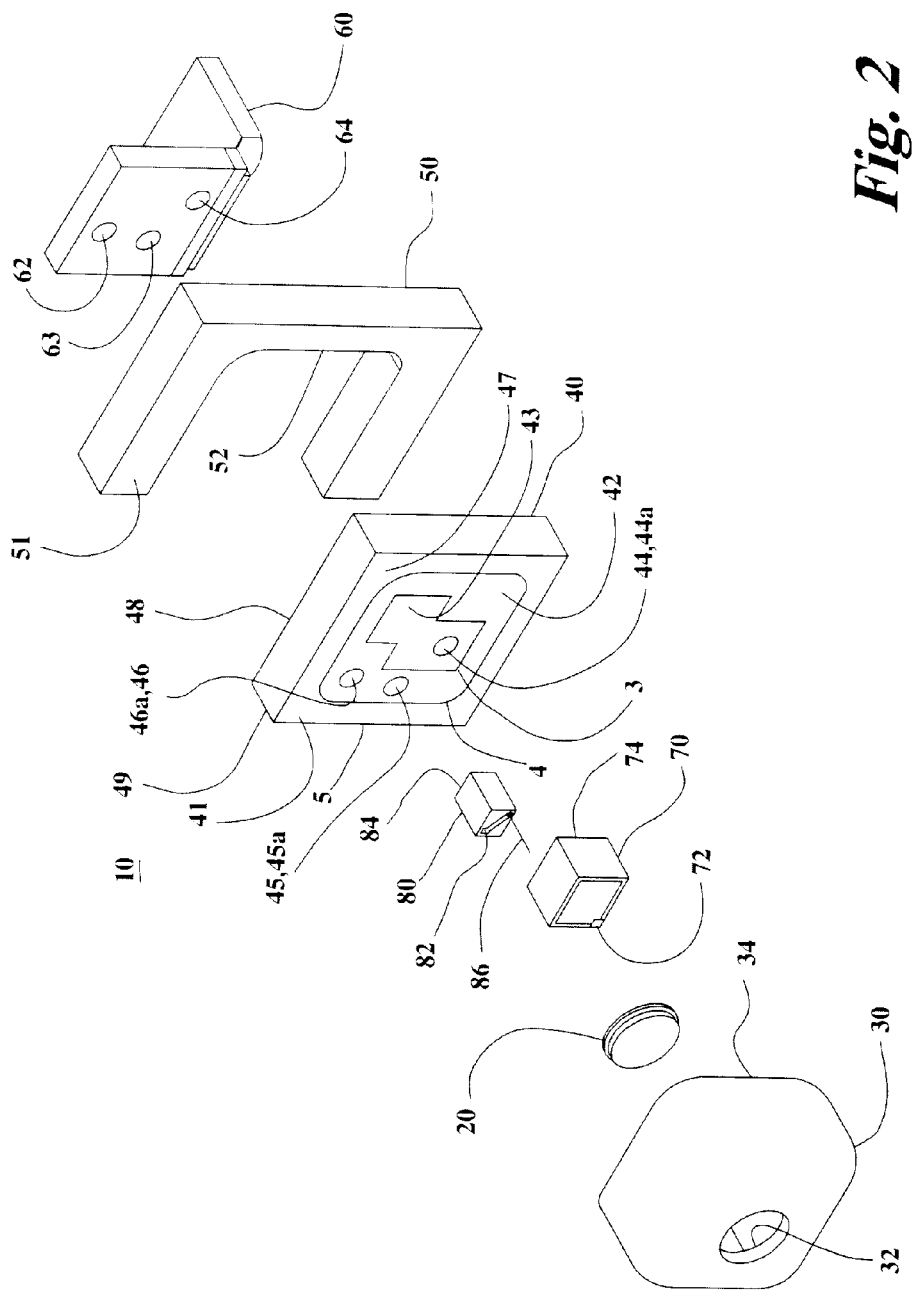
FIG. 2 is an exploded perspective view of the optoelectronic package of FIG. 1.

FIG. 2 is an exploded perspective view of the optoelectronic package 10 of FIG. 1. The electrically conductive can 30 has a first aperture 32 and a second aperture 34. The transparent element 20 is mounted on and sealed to the first aperture 32 of the electrically conductive can 30 by means known in the art. One means includes using glass frit powder packed around the transparent element 20 while it is in the first aperture 32 of the electrically conductive can 30 and then firing the assembly so as to cause the glass frit powder to flow and to bond and to hermetically seal the transparent element 20 in the first aperture 32. Another means includes molding or flowing molten glass into the first aperture 32 and letting the molten glass solidify, thus forming the transparent element 20. The non-electrically conductive substrate 40 has a first surface 47 and a second surface 48 separated by a thickness as identified along edge 49, the thickness is between 0.008 inches and 0.025 inches. The first surface 47 is divided into 3 regions. The first region 43 is bound by line 3. The second region 42 is bound by lines 3 and 4. The third region 41 is bound by lines 4 and 5. The regions include a first region 43, a second region 42, and a third region 41. The first region 43 is separated from the third region 41 by the second region 42.

The non-electrically conductive substrate 40 includes three through-holes. The three through-holes include the first through-hole 44, a second through-hole 46, and a third through-hole 45. Each through-hole has a diameter of approximately 0.010 inches. An electrically conductive plating or coating is adhered to the first surface 47 of the non-electrically conductive substrate 40 in the first region 43 and in the third region 41. The plating typically has a thickness of 0.003 inches. Furthermore, the electrically conductive material, which can be the same as the plating material, substantially fills the first through-hole 44, the second through-hole 46, and the third through-hole 45, so as to form first, second, and third conductive vias 44a, 46a, and 45a, respectively. Each electrically conductive via is substantially co-planar with the surfaces 47, 48 of the non-electrically conductive substrate 40. Specifically, the vias do not substantially protrude into the space defined by the transparent element 20, the electrically conductive can 30, and the non-electrically conductive substrate 40, so as to enable surface mounting of components directly on top of the vias. The first conductive via is electrically connected to the electrically conductive plating of the first region 43. The optical diode 80 has a first lead 82 and a second lead 84. The optical emitting diode 80 has an optical axis 86 along which optical energy is transmitted. The second lead 84 of the optical diode 80 is electrically connected to an electrically conductive plating of the first region 43 and mounted thereto by way of electrically conductive epoxy (not shown). The monitor diode 70 has a first lead 74 and a second lead 72. The first lead 74 of the monitor diode 70 is electrically connected to the electrically conductive plating of the first region 43. The monitor diode 70 is mounted to the electrically conductive plating of the first region 43 by way of electrically conductive epoxy (not shown). A longitudinal axis of the first through-hole 44 passes through the monitor diode 70. However, the optical diode 70 can be placed over the first through-hole 44 instead of the monitor diode 80.

To attach the holder 50 to the non-electrically conductive substrate 40, a portion of the second surface 48 has the electrically conductive plating adhered thereto and to which the holder 50 is either brazed or soldered. Alternatively, glass frit powder can be placed between the holder 50 and the non-electrically conductive substrate 40 and then the assembly is fired so as to bond the holder 50 to the non-electrically conductive substrate.

The electrically conductive can 30 is then mounted on and sealed to the third region 41 of the non-electrically conductive substrate 40. The electrically conductive can 30 is soldered to electrically conductive plating adhered to the third region 41. The optical emitting diode 80 and monitor diode 70 are hermetically sealed and protected from atmospheric and environmental contaminants. Preferably, the sealed-off region is filled with a dry inert gas. Examples of the inert gas include nitrogen and argon. In another embodiment, the sealed-off region is in a vacuum. The holder 50 has a first surface 51 and a concave portion 52. The first surface 51 is soldered to electrically conductive plating adhered to the non-electrically conductive substrate. The flex connector 60 has three conductive traces, which includes a first conductive trace 64, a second conductive trace 62, and a third conductive trace 63. The flex connector 60 may be formed of a polyimide film, such a material is marketed under the trade name, KAPTON, which is sold by E.I. Du Pont de Nemours and Company. The conductive traces 62, 63, and 64 transmit electrical data and power signals to the diodes 70, 80. The flex connector 60 passes through the concave portion 52 of the holder 50 and each of the conductive traces electrically connects with respective electrically conductive vias. That is, the first conductive trace 64 electrically connects to conductive via 44*a*, electrically conductive trace 62 electrically connects to electrically conductive via 46*a*, and electrically conductive trace 63 electrically connects to electrically conductive via 45*a*.

Figure 3:
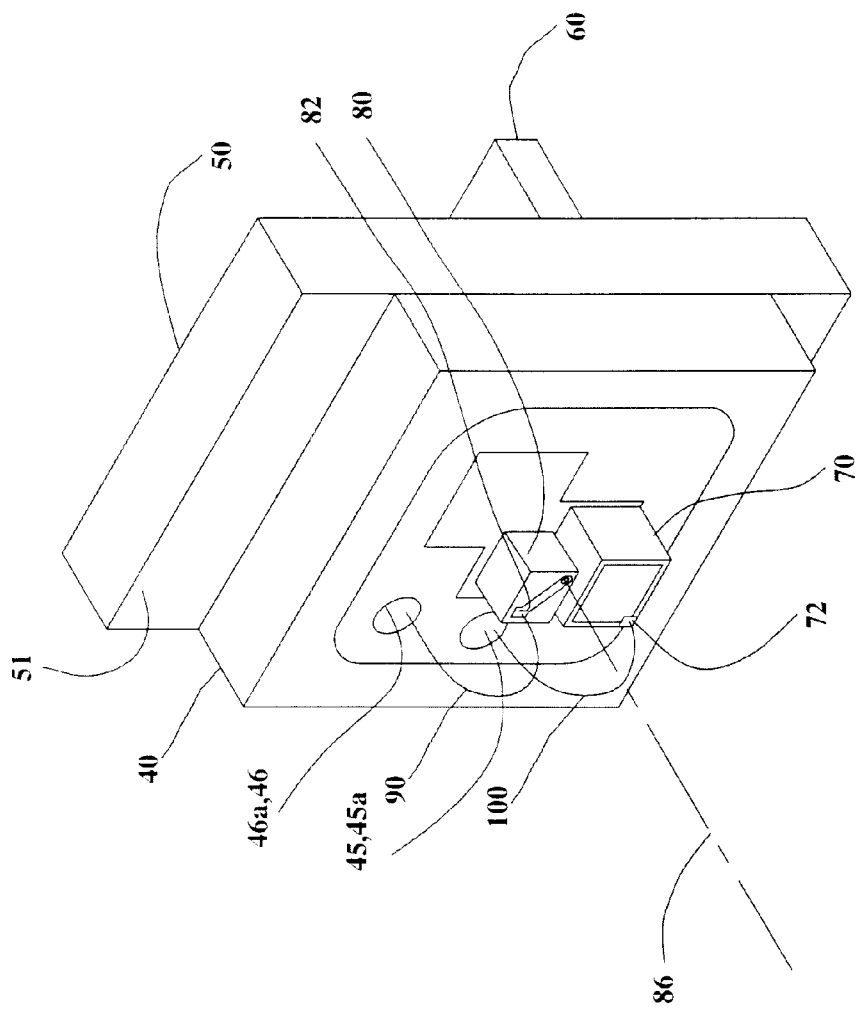
FIG. 3 is a perspective view of the monitor diode, optical diode, base substrate, holder, and flex connector of the optoelectronic package of FIG. 1.

FIG. 3 is a perspective view of the monitor diode 70, the optical diode 80, the non-electrically conductive substrate 40, the holder 50, and the flex connector 60 of the small format optoelectronic package 10 of FIG. 1. FIG. 3 shows the optical diode 80 and the monitor diode 70 mounted to the first region 43 of the non-electrically conductive substrate 40. FIG. 3 further shows the optical axis 86 of the optical diode 80. A first conductor 90, for example, a wire bond, electrically connects the first lead 82 of the optical diode 80 to the electrically conductive material filling the second through-hole 46 or to a metallized region surrounding the via. A second conductor 100 electrically connects the second lead 72 of the monitor diode 70 to the electrically conductive material filling the third through-hole 45 or to a metallized region surrounding the via.

The holder 50 needs to be solderable and weldable, as well as having a coefficient of thermal expansion which generally is the same as the coefficient of thermal expansion of the non-electrically conductive substrate 40 which is a ceramic material. Such materials include FeNi and FeNiCo. Specifically, a material having twenty-nine percent Ni, seventeen percent Co, and the balance Fe trades under the name KOVAR, the name is owned by Carpenter Technology Corporation. The flex connector 60 has a base substrate made of a flexible insulating material such as KAPTON and on which electrically conductive traces are laid. Non-electrically conductive substrate 40 is made of a ceramic material such as alumina, AlN or BeO. The electrically conductive plating material is typically made of a mixture of glass, palladium, and silver which is mixed together, applied to the ceramic material, and heated to a molten state and allowed to solidify. The glass component of the mixture fuses with the base ceramic material of the non-electrically conductive substrate 40. The palladium/silver component of the mixture provides for the electrical conductivity of the plating. The electrically conductive can 30 is typically made of an alloy, such as KOVAR, which has a coefficient of thermal expansion which generally is the same as the coefficient of thermal expansion for both the non-electrically conductive substrate 40 which is ceramic and the transparent element 20 which is glass. The electrically conductive can 30 is attached to the electrically conductive plating material adhered to the third region 41 of the non-electrically conductive substrate 40 in order to form a hermetic barrier. The electrically conductive can 30 is attached to the non-electrically conductive substrate 40, preferably, by a soldering process or by a brazing process. The transparent element 20 is made of glass or sapphire. The conductors 90, 100 are substantially made of gold and are affixed to the vias 45*a*, 46*a* and to the leads 72, 82 by way of a gold bond technique where the gold conductor touches the lead, which is held at a temperature above ambient, or via and is vibrated. An exposed surface of the vias may have a secondary plating of gold to enhance wire bond adhesion. The vibrations and the elevated temperature cause the gold conductor to adhere to the lead.

Figure 8:
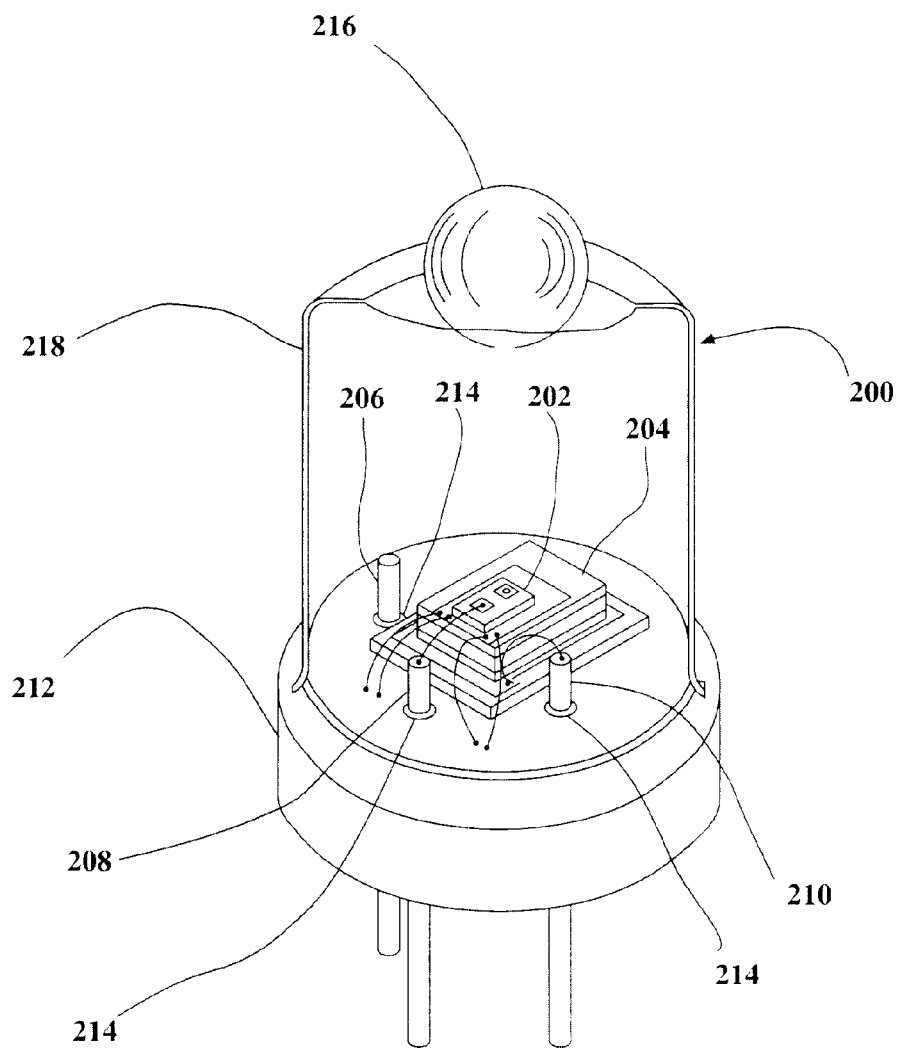
FIG. 8 is a partial cross-sectional perspective view of a related optoelectronic package

The unique combination of materials and arrangement of components allows the width dimension W to be 3.25 millimeters or less. The optical axis 86 is positioned midway along the width dimension W. As compared to the device 200 of the related art shown in FIG. 8, the device 10 of FIG. 1 is compact. The non-electrically conductive substrate 40 has electrically conductive vias 44*a*, 45*a*, and 46*a*, and electrically conductive regions 41 and 43, which forms an unique electrical circuit arrangement based on geometry and material selection. The non-electrically conductive substrate 40 also has a unique shape which is rectangular or square. The shape and materials of construction allow two or more of the devices 10 to be placed together, and eliminate the wasted area present on the device 200 of FIG. 8.

Figure 7:
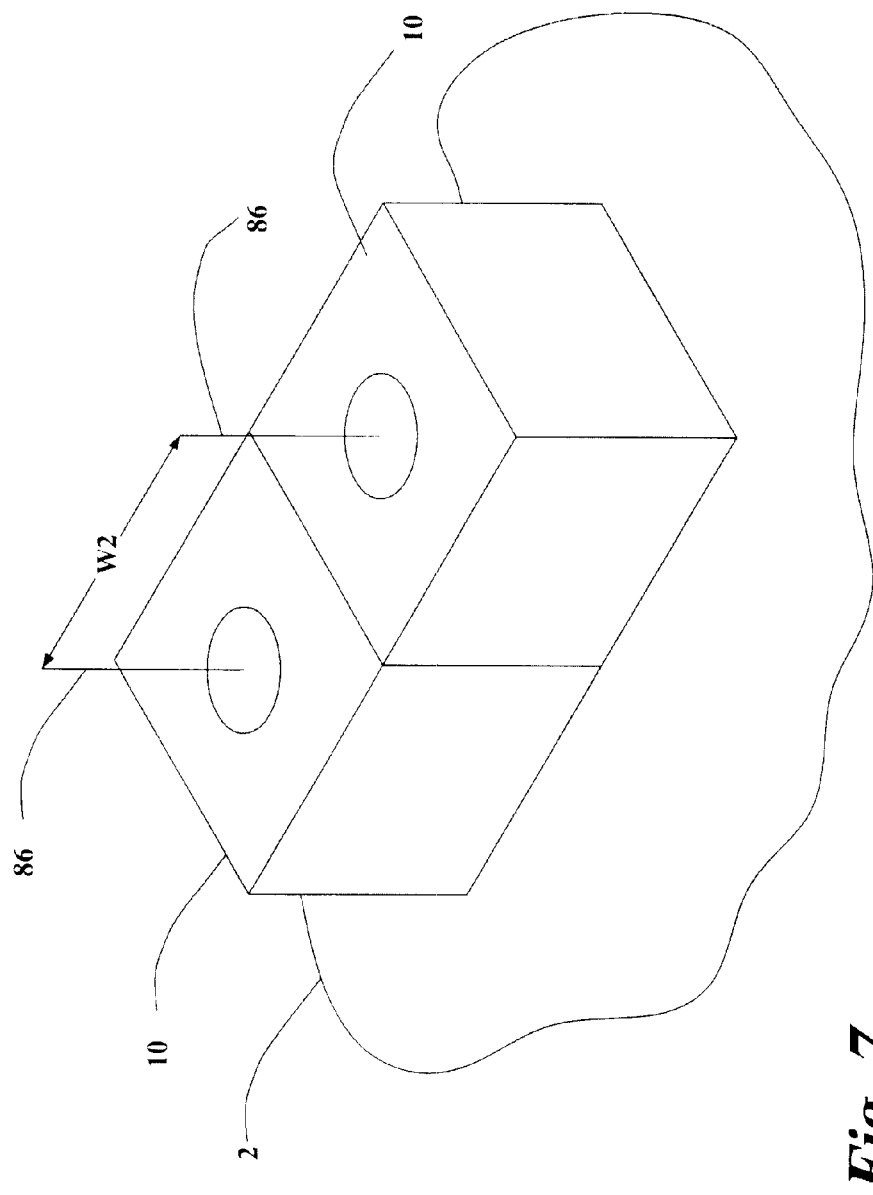
FIG. 7 is a perspective view of two optoelectronic packages positioned side-by-side on a planar surface.

The structure of the small format optoelectronic package or device 10 allows for two of the devices 10, 10 to be placed on the same plane 2 adjacent to each other, as shown in FIG. 7. In such an arrangement, the optical axis 86 of each device 10 are separated by a distance, W2. The distance, W2, is 3.25 millimeters or less.

Figure 4:
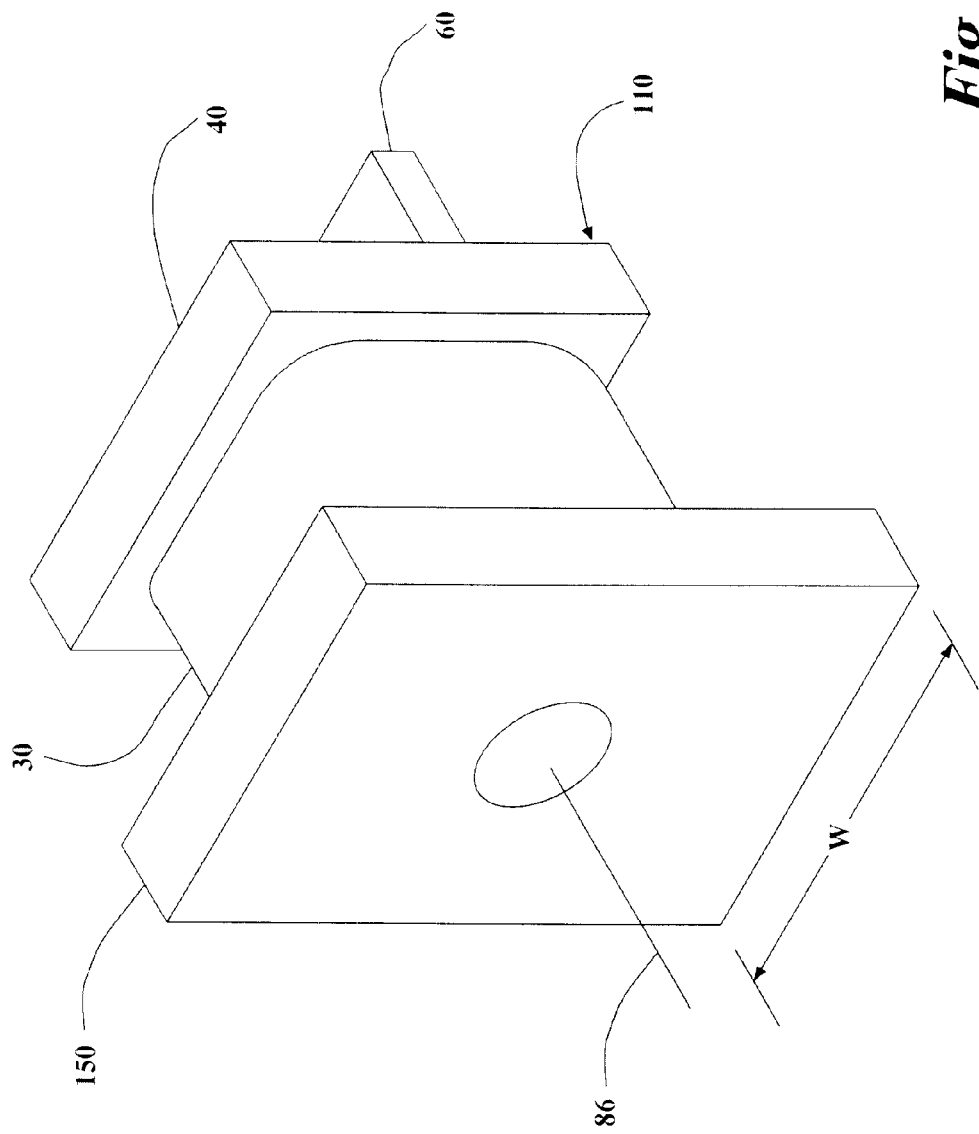
FIG. 4 is a perspective view of a second embodiment of the optoelectronic package.
Figure 5:
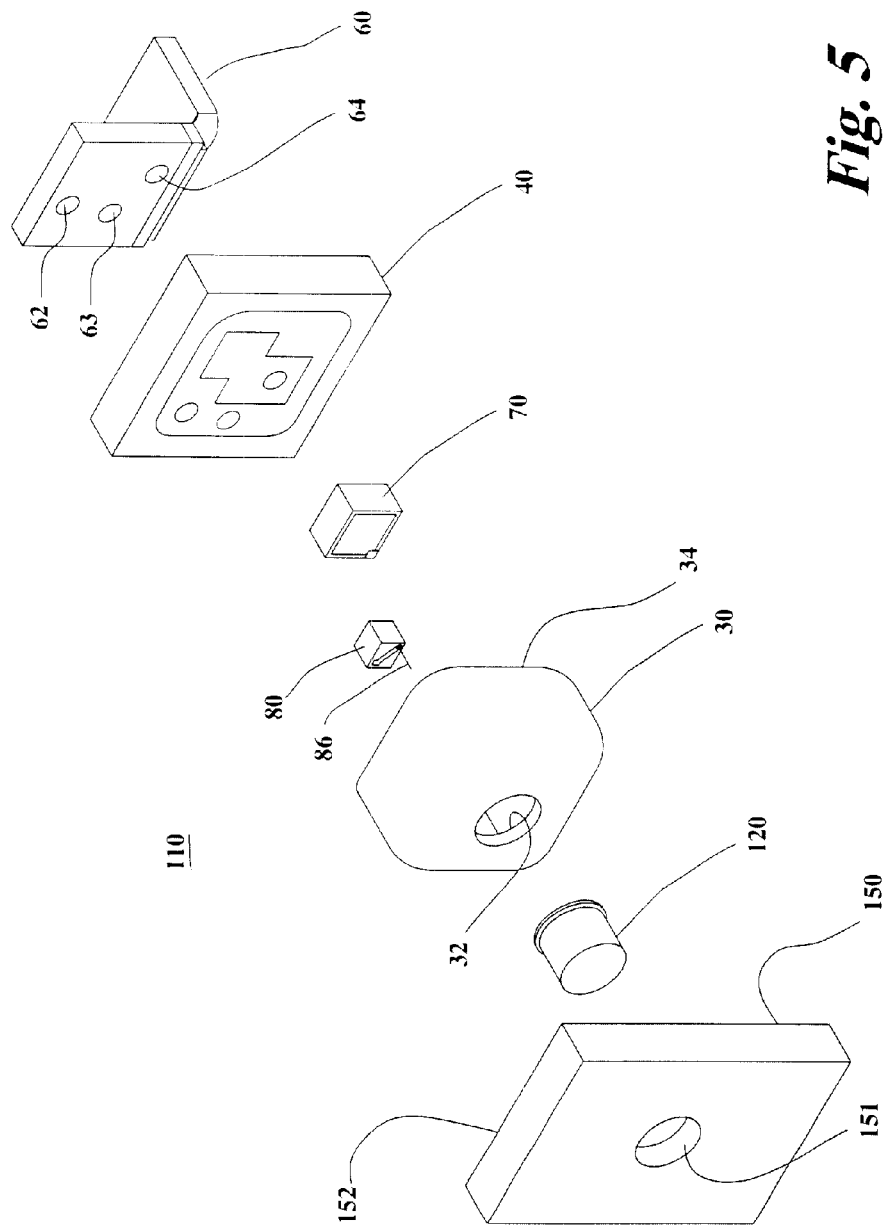
FIG. 5 is an exploded perspective view of the optoelectronic package of FIG. 4.
Figure 6:
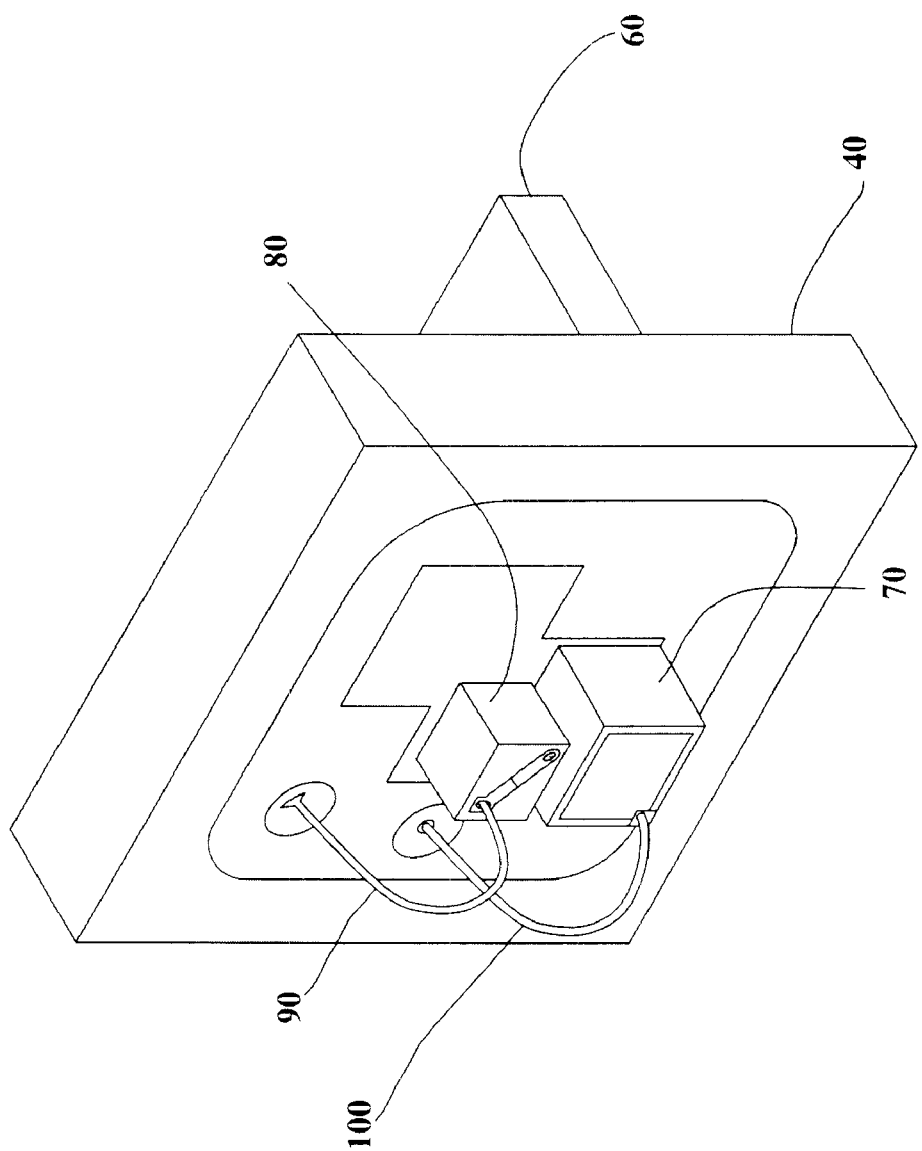
FIG. 6 is a perspective view of the monitor diode, optical diode, base substrate, and flex connector of the optoelectronic package of FIG. 4.

FIGS. 4–6 show a second embodiment of the small format optoelectronic package or device 110. The device 110 includes many of the same components as does the device 10. The device 1 10 includes the optical diode 80, the monitor diode 70, the non-electrically conductive substrate 40, the flex connector 60, the electrically conductive can 30, and first and second conductors 90, 100. Since the listed components are the same as previously discussed in regard to device 10 they are not discussed further in the discussion of the embodiment of device 110.

A transparent element 120 is mounted on and sealed to the first aperture 32 of the electrically conductive can 30. A holder 150 has an aperture 151 and a surface 152. The aperture 151 receives the transparent element 120. The surface 152 of the holder 150 is brazed or welded to the electrically conductive can 30. The device 110 can be mounted within another housing by way of the holder 150 from a location of the electrically conductive can 30 which is different than the device 10. The materials of construction are similar to those discussed in regard to the device 10.

The devices 10, 110 work well, especially when the optical diode 80 is a vertical cavity surface emitting laser. Vertical cavity surface emitting laser which emit an optical signal at a frequency of approximately 850 nm are readily available. Vertical cavity surface emitting lasers which emit an optical signal at a frequency of approximately 1310 nm are not readily available. The market place is asking for small format optical subassemblies which operate at 1310 nm.

However, edge emitting optical diodes such as Fabry-Perot device are readily available in a wavelength in the range of 1310 nm. The drawback to an edge emitting optical diode is that the diode emits its signal out of its edge or side and not at its top surface as does a vertical cavity surface emitting laser.

Figure 9:
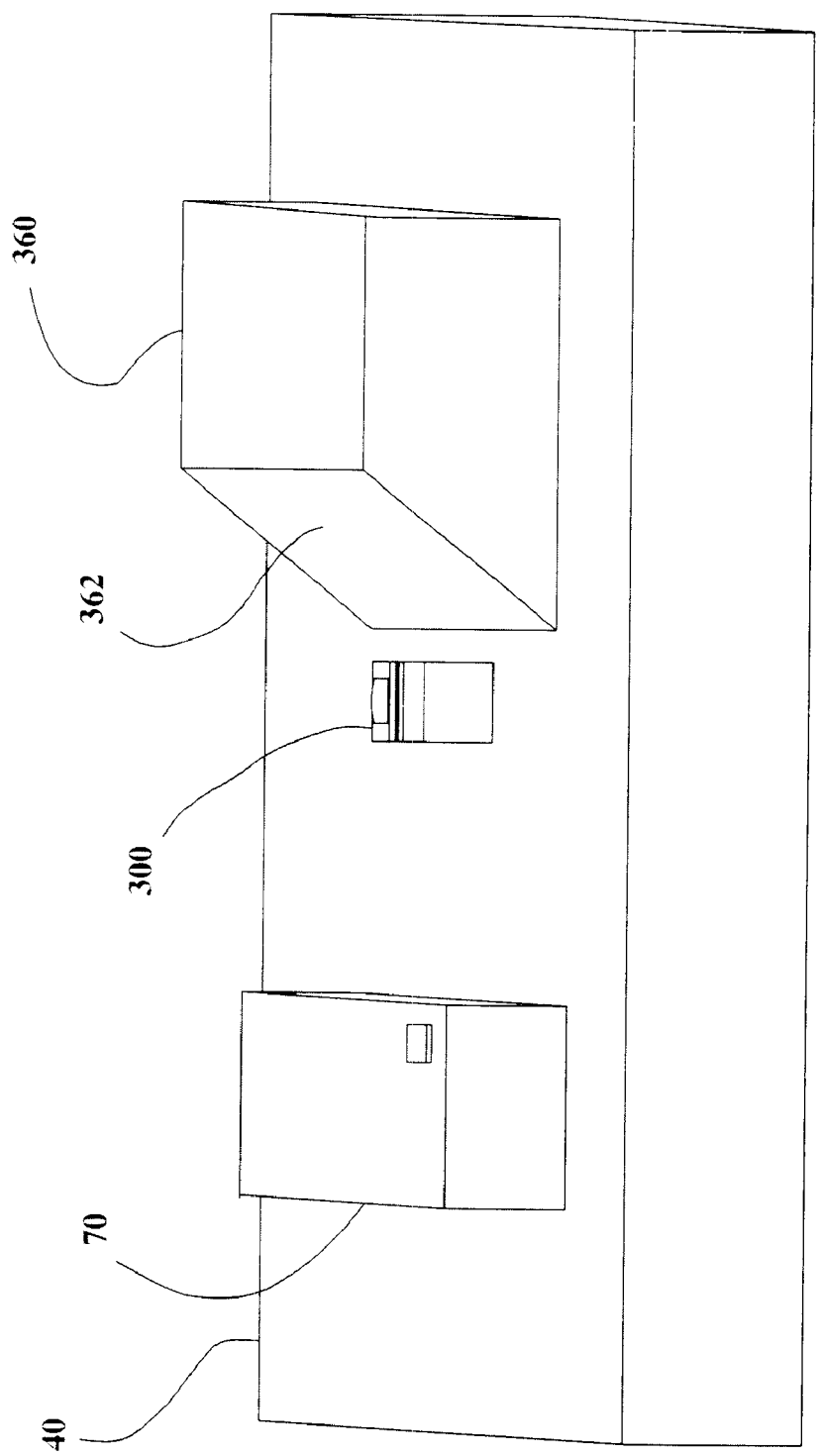
FIG. 9 is a perspective view of an embodiment of the invention where the optical diode of FIGS. 1–7 is replaced with an edge emitting optical diode and a plane reflecting mirror.

The problem of providing a 1310 nm optical subassembly is solved by the embodiment shown in FIG. 9. FIG. 9 is a perspective side view of an edge emitting optical diode 300, a plane reflecting mirror 360, a monitor diode 70, and a non-electrically conductive substrate 40. The solution to the described problem replaces the optical diode 80 of the device 10, as shown in FIGS. 2 and 3, with the edge emitting optical diode 300 and the plane reflecting mirror 360. All other aspects of the invention are the same as the device 10 and as such are not discussed further. The edge emitting optical diode 300 is mounted to the non-electrically conductive substrate 40 in the same way as is the optical diode 80. The plane reflecting mirror 360 can be mounted to the non-electrically conductive substrate 40 by way of an adhesive or by fusing with a glass frit powder or other suitable material. The plane reflecting mirror 360 may be conductive or non-electrically conductive and can be mounted to non-conductive or conductive portions of the non-electrically conductive substrate 40.

The plane reflecting mirror 360 has a surface 362 which is used to reflect the optical signal emanating from the edge emitting optical diode 300 out of the small format optical subassembly through its transparent element 20 (see FIGS. 1 and 2). Therefore, the combination of the edge emitting optical diode 300 and the plane reflecting mirror 360 can act as a substitute for the optical diode 80 and is the first embodiment of the invention.

Figure 10:
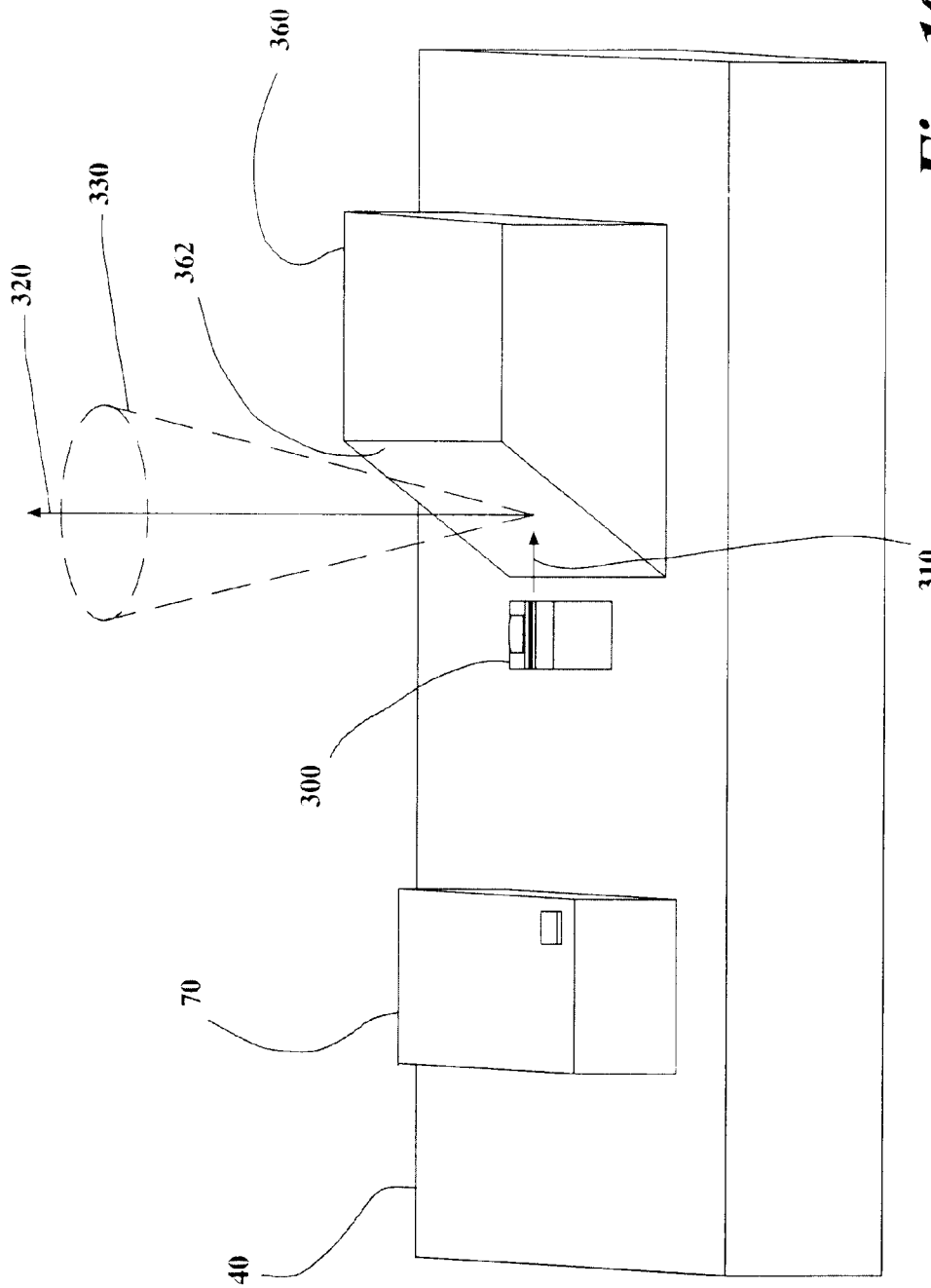
FIG. 10 is the perspective view of the device shown in FIG. 9 with the addition of optical axes and an optical signal schematically shown.

FIG. 10 is the perspective view of FIG. 9 showing a first optical axis 310 and a second optical axis 320. An optical signal emanates from the edge emitting optical diode 300 and travels along the first optical axis 310. The reflective surface 362 of the plane reflecting mirror 360 is positioned so as to intersect the first optical axis 310. Once the optical signal reaches the reflective surface 362, the optical signal is reflected and travels along the second optical axis 320. A schematic representation of the reflected optical signal 330 is shown in FIG. 10.

Figure 11:
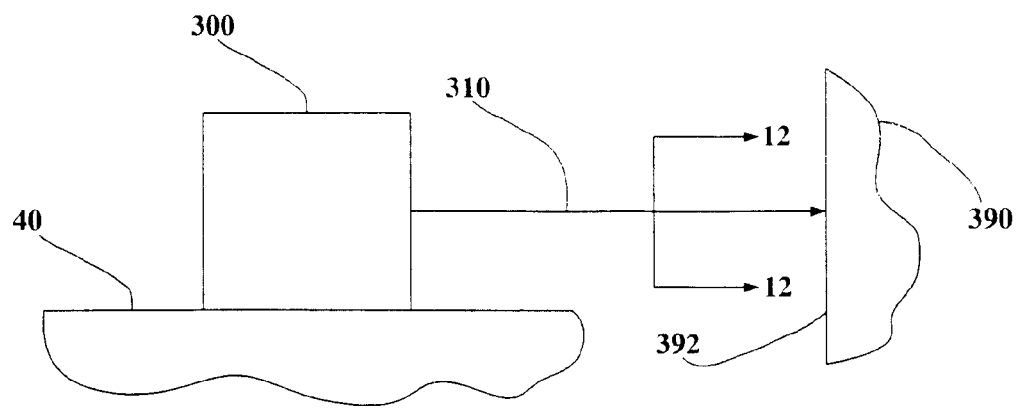
FIG. 11 is a side view of an edge emitting optical diode.
Figure 12:
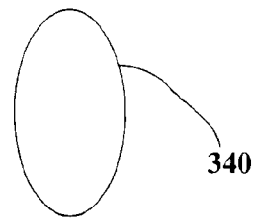
FIG. 12 is a plan view of a projection of the optical signal emanating from the edge emitting optical diode.

FIG. 11 is a side view of the edge emitting optical diode 300 mounted to the non-electrically conductive substrate 40. FIG. 11 further shows the optical axis 310 and a display surface 392 of a display device 390 such as a wall. The display surface 392 and display device 390 are used merely to convey an idea of the shape of the optical signal. The optical signal of the edge emitting optical diode 300 is projected on the display surface 392. FIG. 12 is a plan view of a portion of the display surface 392 taken along line 12—12 of FIG. 11 which shows the projection 340 of the optical signal thereon. The projection 340 has a shape which is approximately similar to an ellipse.

Figure 13:
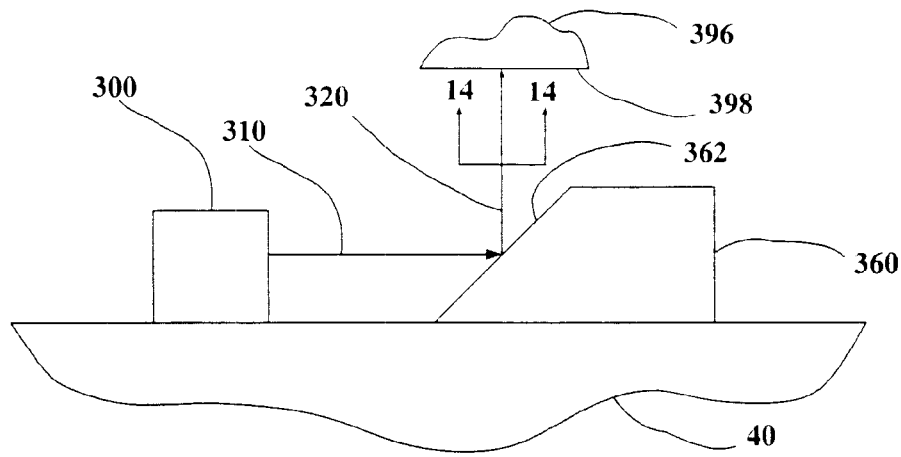
FIG. 13 is a side view of an edge emitting optical diode and a plane reflecting mirror.
Figure 14:
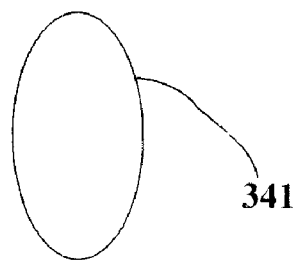
FIG. 14 is a plan view of a projection of the optical signal reflected by the plane reflecting mirror.

FIG. 13 is a side view of the edge emitting optical diode 300, the plane reflecting mirror 360, and a display surface 398 of a display device 396. The display surface 398 and display device 396 are used merely to convey an idea of the shape of the optical signal. The first optical axis 310 is shown along with the second optical axis 320. The reflected optical signal travels along the second optical axis 320 and is projected on the display surface 398. FIG. 14 is a plan view of a portion of the display surface 398 taken along line 14—14 of FIG. 13 which shows the projection 341 of the optical signal thereon. The projection 341 has a shape which is approximately similar to an ellipse.

Figure 15:
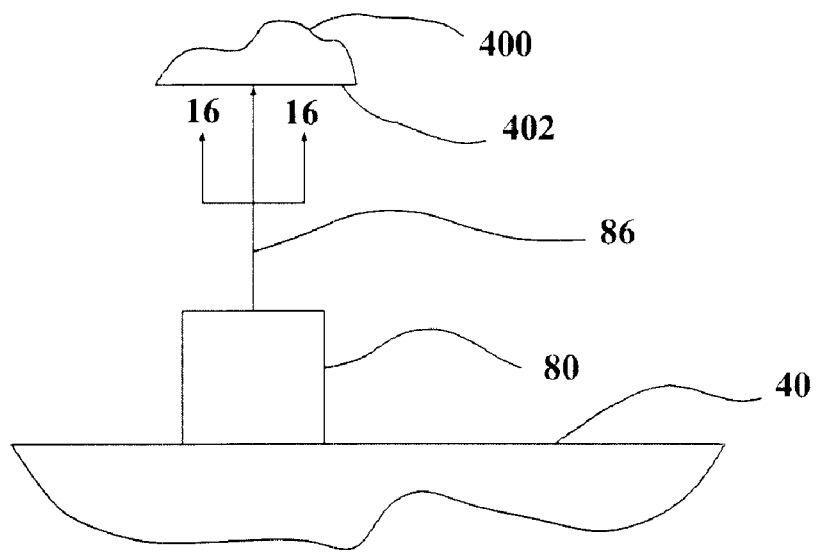
FIG. 15 is a side view of a vertical cavity surface emitting laser.
Figure 16:
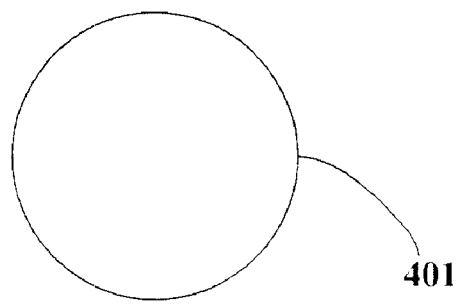
FIG. 16 is a plan view of a projection of the optical signal emanating from the vertical cavity surface emitting laser.

As a comparison, FIG. 15 is a side view of the optical diode 80, such as a vertical cavity surface emitting laser, which provides an optical signal which travels along the optical axis 86. The optical signal is projected on display surface 402 of the display device 400. The display surface 402 and display device 400 are used merely to convey an idea of the shape of the optical signal. FIG. 16 is a plan view of the display surface 402 taken along line 16—16 of FIG. 15 which shows the projection 401 of the optical signal thereon. The projection 401 has a shape which is approximately similar to a circle.

Since the circularly shaped projection 401 of the vertical cavity surface emitting laser is more similar to the cross-sectional shape of an optical fiber, more of the optical signal enters the optical fiber than does the elliptically shaped projection 341 of the edge emitting optical diode 300. In order to increase the efficiency of the first embodiment of the invention, it is desired to alter the projected shape of the optical signal of the edge emitting optical diode 300.

Figure 17:
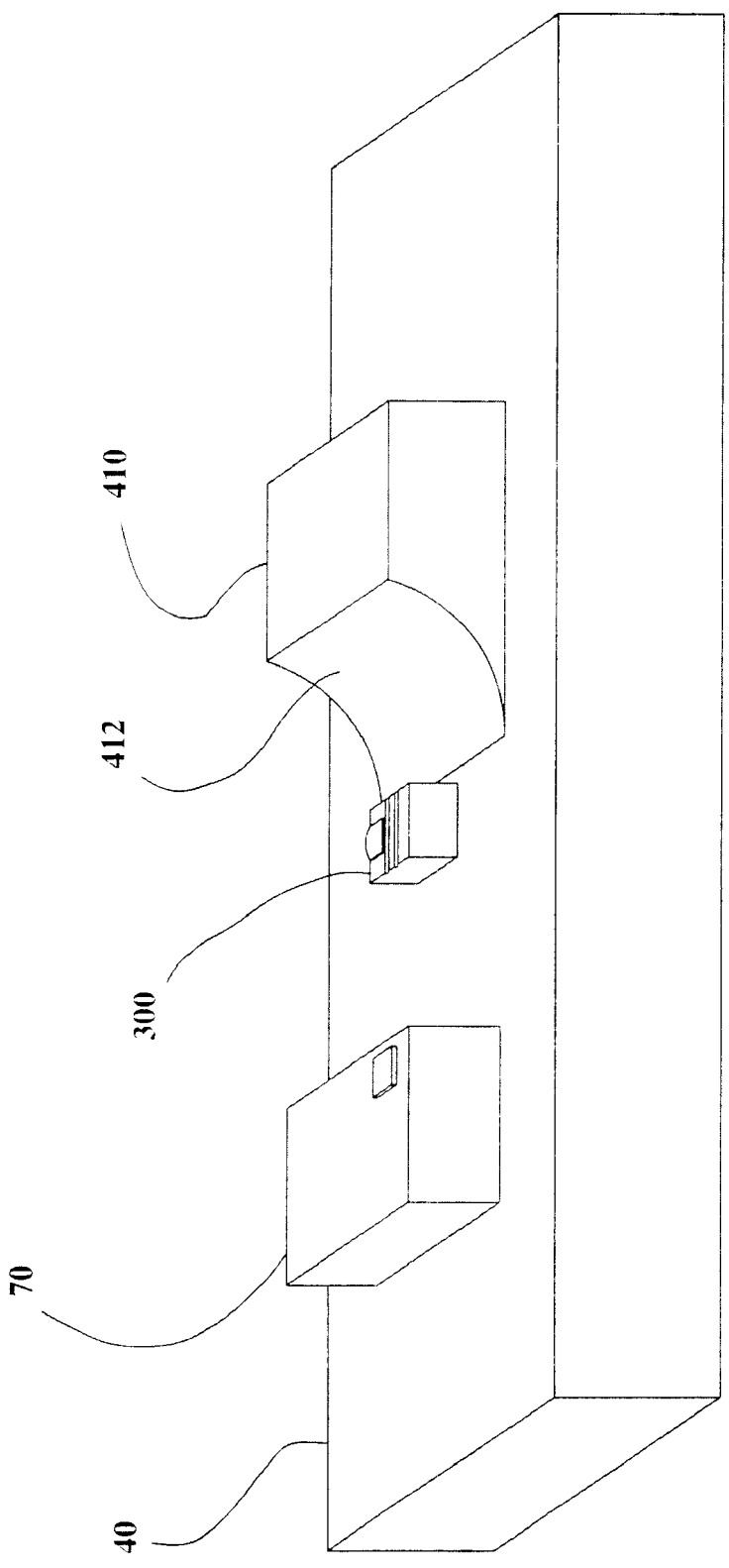
FIG. 17 is a side view of a device similar to the device shown in FIG. 9 where the plane reflecting mirror of FIG. 9 is replaced with a concave, cylindrical reflecting mirror.

FIG. 17 is a perspective view of a second embodiment of the invention. The embodiment shown in FIG. 17 is similar to the embodiment shown in FIG. 9 except for one difference, the plane reflecting mirror 360 as shown in FIG. 9 is replaced with a concave, cylindrical reflecting mirror 410. The concave, cylindrical reflecting mirror 410 has a reflective surface 412 which reflects the optical signal of the edge emitting optical diode 300.

Figure 18:
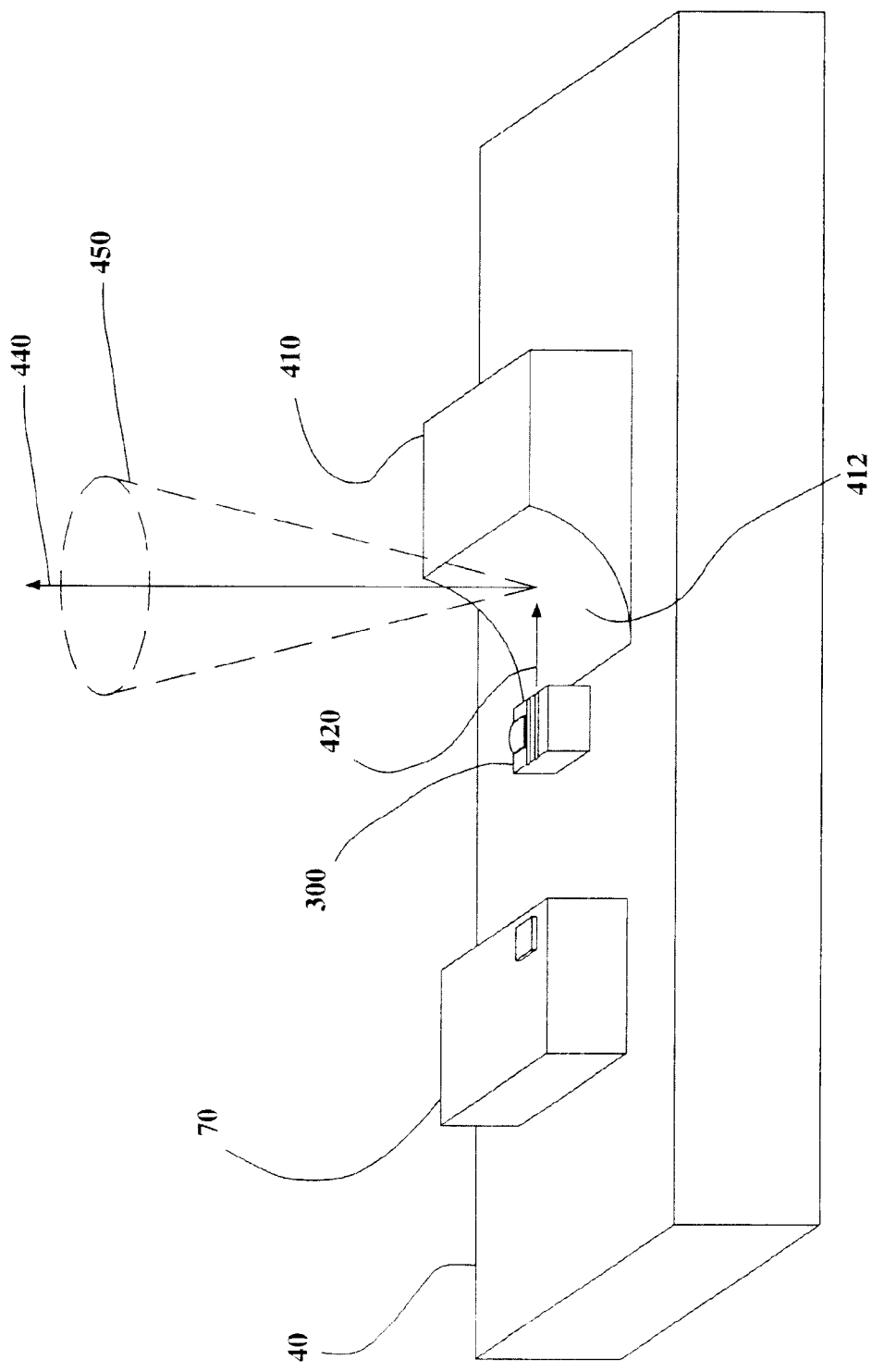
FIG. 18 is the perspective view of the device shown in FIG. 17 with the addition of optical axes and an optical signal schematically shown therein.

FIG. 18 is the perspective view of the arrangement shown in FIG. 17 showing a first optical axis 420 and a second optical axis 440. An optical signal emanates from the edge emitting optical diode 300 and travels along the first optical axis 420. The reflective surface 412 of the concave, cylindrical reflecting mirror 410 is positioned so as to intersect the first optical axis 420. Once the optical signal reaches the reflective surface 412, the optical signal is reflected and travels along the second optical axis 440. A schematic representation of the reflected optical signal 450 is shown.

Figure 19:
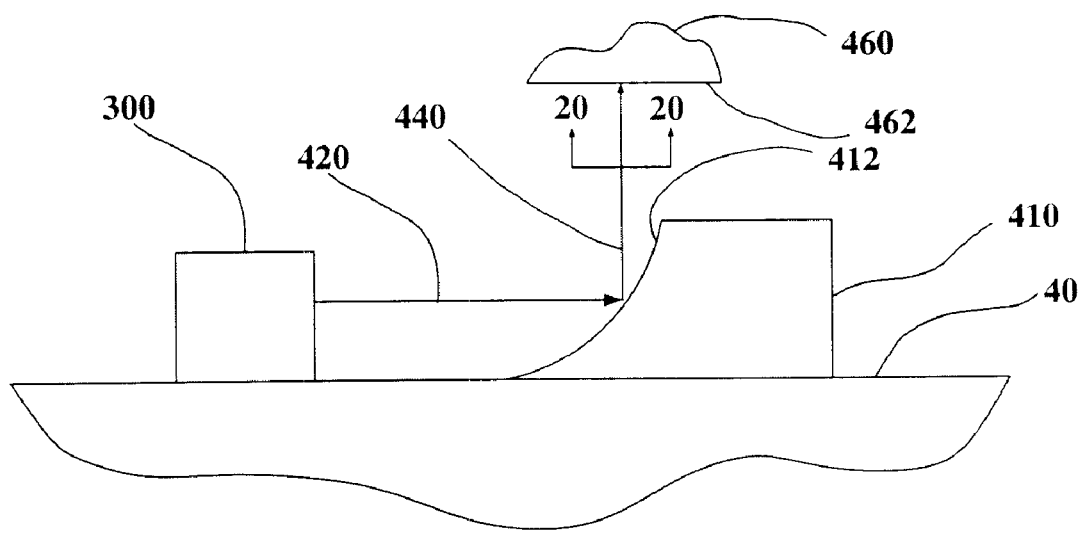
FIG. 19 is a side view of the edge emitting optical diode, the concave, cylindrical mirror, and a display surface of a display device.
Figure 20:
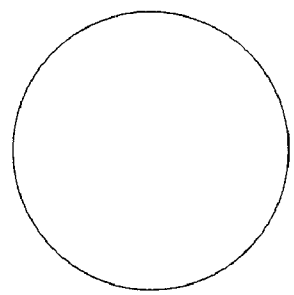
FIG. 20 is a plan view of a portion of the display surface taken along line 20–20 of FIG. 19.

FIG. 19 is a side view of the edge emitting optical diode 300, the concave, cylindrical mirror 410, and a display surface 462 of a display device 460. The display surface 462 and display device 460 are used merely to convey an idea of the shape of the optical signal. FIG. 20 is a plan view of a portion of the display surface 462 taken along line 20—20 of FIG. 19 which shows the projection 461 of the optical signal thereon. The projection 461 has a shape which is approximately similar to a circle. Therefore, the second embodiment of the invention is more efficient in regard to the coupling of available power present into an optical fiber.

The concave, cylindrical mirror 410 has a radius along one orthogonal and an infinite radius along another orthogonal axis which provides an essentially flat or linear dimension. Thus, the optical signal is condensed along the major axis of the ellipse due to the curvature of the reflective surface 412 and the width of the optical signal along the minor axis of the ellipse is essentially unchanged. Other curved mirror surfaces such as parabolic, exponential, or et cetera, may be utilized to condense the elliptical beam along an axis.

The invention can also be used in a device similar to that described above where the package does not include a monitor diode and its associated conductor.

In another embodiment, the holder and the electrically conductive can are made of a non-magnetic material.

In still yet another embodiment, a laser driver circuit, a PIN diode amplifier, or other signal conditioning electronic components are placed within the space defined by the non-electrically conductive substrate, the transparent element, and the electrically conductive can.

In yet another embodiment, as shown in FIG. 1, the electrically conductive can has a height, CH. Preferably, the electrically conductive can height, CH, is nominally equal to 0.030 inches. However, the electrically conductive can height may be substantially equal to 0.040 inches. The electrically conductive can height, CH, is measured as the furthest point of the electrically conductive can 30 from the non-electrically conductive substrate 40 measured along a line perpendicular to the surface of the non-electrically conductive substrate 40.

Obviously, numerous modifications and variations of the present invention are possible in light of the above teachings. For example, the optical diode may be a detector photo diode or a laser such as a vertical cavity surface emitting laser (VCSEL) or a light emitting diode. Therefore, the present invention may provide a transmitting optical subassembly (TOSA) or a receiving optical subassembly (ROSA). It is therefore to be understood that within the scope of the appended claims, the invention may be practiced otherwise than as specifically described herein.

What is claimed is:

1. A device comprising:
a non-electrically conductive substrate having a first surface and a second surface, the first surface separated from the second surface by a thickness of the non-electrically conductive substrate, the first surface having a first region, a second region, and a third region, the first region having a first through-hole extending through the thickness, the second region having a second through-hole extending through the thickness and a third through-hole extending through the thickness, the first region being separated from the third region by the second region;
an electrically conductive plating substantially covering both the first region and the third region of the first surface;
an electrically conductive material substantially filling the first through-hole so as to form a first electrically conductive via, the electrically conductive material substantially filling the second through-hole so as to form a second electrically conductive via, and the electrically conductive material substantially filling the third through-hole so as to form a third electrically conductive via, and the electrically conductive plating substantially covering the first region being electrically connected to the electrically conductive material substantially filling the first through-hole;
an edge emitting optical diode having a first lead and a second lead, the first lead of the edge emitting optical diode electrically connected to the electrically conductive plating of the first region, the first lead of the edge emitting optical diode electrically connected to the first electrically conductive via, the second lead of the edge emitting optical diode electrically connected to the second electrically conductive via, the edge emitting optical diode having a first optical axis, and the edge emitting optical diode being capable of emitting an optical signal along the first optical axis;
a reflecting mirror mounted to the non-electrically conductive substrate, the reflecting mirror having a reflective surface;
a monitor diode having a third lead and a fourth lead, the third lead of the monitor diode electrically connected to the electrically conductive plating of the first region, the third lead of the monitor diode electrically connected to the first electrically conductive via, the fourth lead of the monitor diode electrically connected to the third electrically conductive via;
an electrically conductive can having a first aperture and a second aperture; and
a transparent element mounted on and sealed to the first aperture of the electrically conductive can, and wherein the second aperture of the electrically conductive can is mounted on and sealed to the electrically conductive plating adhered to the third region of the non-electrically conductive substrate so as to seal the monitor diode, the reflecting mirror, and the edge emitting optical diode from an ambient atmosphere, and wherein
the reflective surface of the reflecting mirror intersects the first optical axis of the edge emitting optical diode so as to reflect the optical signal of the edge emitting optical diode from the first optical axis to a second optical axis, and wherein the second optical axis passes through the transparent element.

2. A device comprising:
a non-electrically conductive substrate having a first surface and a second surface, the first surface separated from the second surface by a thickness of the non-electrically conductive substrate, the first surface having a first region, a second region, and a third region, the first region having a first through-hole extending through the thickness, the second region having a second through-hole extending through the thickness, the first region being separated from the third region by the second region;
an electrically conductive plating substantially covering both the first region and the third region of the first surface;
an electrically conductive material substantially filling the first through-hole so as to form a first electrically conductive via, and the electrically conductive material substantially filling the second through-hole so as to form a second electrically conductive via, and the electrically conductive plating substantially covering the first region being electrically connected to the electrically conductive material substantially filling the first through-hole;
an edge emitting optical diode having a first lead and a second lead, the first lead of the edge emitting optical diode electrically connected to the electrically conductive plating of the first region, the first lead of the edge emitting optical diode electrically connected to the first electrically conductive via, the second lead of the edge emitting optical diode electrically connected to the second electrically conductive via, the edge emitting optical diode having a first optical axis, and the edge emitting diode being capable of emitting an optical signal along the first optical axis;

a reflecting mirror mounted to the non-electrically conductive substrate, the reflecting mirror having a reflective surface;

an electrically conductive can having a first aperture and a second aperture; and a transparent element mounted on and sealed to the first aperture of the electrically conductive can, and wherein
the second aperture of the electrically conductive can is mounted on and sealed to the electrically conductive plating adhered to the third region of the non-electrically conductive substrate so as to seal the edge emitting optical diode and the reflecting mirror from an ambient atmosphere, and wherein
the reflective surface of the reflecting mirror intersects the first optical axis of the edge emitting optical diode so as to reflect the optical signal of the edge emitting optical diode from the first optical axis to a second optical axis, and wherein the second optical axis passes through the transparent element.

3. A device comprising:

a non-electrically conductive substrate having a first surface and a second surface, the first surface separated from the second surface by a thickness of the non-electrically conductive substrate, the first surface having a first region, a second region, and a third region, the first region having a first through-hole extending through the thickness, the second region having a second through-hole extending through the thickness, the first region being separated from the third region by the second region;

an electrically conductive plating substantially covering both the first region and the third region of the first surface;

an electrically conductive material substantially filling the first through-hole so as to form a first electrically conductive via, the electrically conductive material substantially filling the second through-hole so as to form a second electrically conductive via, and the electrically conductive plating substantially covering the first region being electrically connected to the electrically conductive material substantially filling the first through-hole;

an edge emitting optical diode having a first lead and a second lead, the first lead of the edge emitting optical diode electrically connected to the electrically conductive plating of the first region, the first lead of the edge emitting optical diode electrically connected to the first electrically conductive via, the second lead of the edge emitting optical diode electrically connected to the second electrically conductive via;

a reflecting mirror mounted to the non-electrically conductive substrate;

an electrically conductive can having a first aperture and a second aperture; and a transparent element mounted on and hermetically sealed to the first aperture of the electrically conductive can, and wherein
the second aperture of the electrically conductive can is mounted on and sealed to the electrically conductive plating adhered to the third region of the non-electrically conductive substrate so as to hermetically seal the edge emitting optical diode and the reflecting mirror from an ambient atmosphere.

4. A device comprising:

a non-electrically conductive substrate having a first region and a second region, the first region having a first through-hole, and the first region having a second through-hole;

an electrically conductive plating substantially covering the second region;

an electrically conductive material substantially filling the first through-hole so as to form a first electrically conductive via, and the electrically conductive material substantially filling the second through-hole so as to form a second electrically conductive via;

an edge emitting optical diode having a first lead and a second lead, the first lead of the edge emitting optical diode electrically connected to the first electrically conductive via, and the second lead of the edge emitting optical diode electrically connected to the second electrically conductive via;

a reflecting mirror mounted to the non-electrically conductive substrate;

an electrically conductive can having a first aperture and a second aperture; and a transparent element mounted on and hermetically sealed to the first aperture of the electrically conductive can, and wherein the second aperture of the electrically conductive can is mounted on and sealed to the electrically conductive plating adhered to the second region of the non-electrically conductive substrate so as to hermetically seal the optical diode and the reflecting mirror from an ambient atmosphere.

* * * * *